United States Patent [19]
Johansson et al.

[11] Patent Number: 5,399,803
[45] Date of Patent: Mar. 21, 1995

[54] VALVE STACK FOR HIGH VOLTAGES HAVING FIRE SCREEN MEANS LOCATED BETWEEN VALVE MODULES

[75] Inventors: Mats Johansson; Fredrik Rüter, both of Ludvika; Urban Aström, Saxdalen, all of Sweden

[73] Assignee: Asea Brown Boveri AB, Vasteras, Sweden

[21] Appl. No.: 238,346

[22] Filed: May 5, 1994

Related U.S. Application Data

[63] Continuation of Ser. No. 817,651, Jan. 7, 1992, abandoned.

[30] Foreign Application Priority Data

Jan. 15, 1991 [SE] Sweden .................. 9100120

[51] Int. Cl.⁶ .................. E04H 12/00; H02M 1/00
[52] U.S. Cl. .................. 174/45 R; 363/68; 361/676
[58] Field of Search .................. 174/42, 45 R, 48, 49, 174/35 R, 35 MS; 52/232, 573, 317; 169/48; 220/88.1, 88.2; 361/128, 379; 363/128, 178, 65, 67, 68; 454/369; 439/181; 126/544

[56] References Cited

U.S. PATENT DOCUMENTS

| | | | |
|---|---|---|---|
| 2,279,791 | 4/1942 | Lamb | 220/88.2 X |
| 3,394,843 | 7/1968 | Grady, Jr. et al. | 220/88.2 |
| 4,475,152 | 10/1984 | Ikegane et al. | 361/379 X |
| 4,578,745 | 3/1986 | Olsson | 363/68 |
| 4,583,158 | 4/1986 | Ikegane et al. | 363/68 |
| 4,816,980 | 3/1989 | Wiendl | 363/68 X |

FOREIGN PATENT DOCUMENTS

| | | | |
|---|---|---|---|
| 211218 | 6/1958 | Australia | 220/88.2 |
| 5225244 | 2/1977 | Japan | 220/88.1 |

Primary Examiner—Peter Dungba Vo
Attorney, Agent, or Firm—Watson, Cole, Grindle & Watson

[57] ABSTRACT

A valve stack for high voltages includes a number of electrically interconnected valve modules, some of which are disposed one above the other. To prevent a large fire in a valve module from spreading upwards to valve modules positioned above it, fire screens are arranged between valve modules located one above the other.

11 Claims, 7 Drawing Sheets

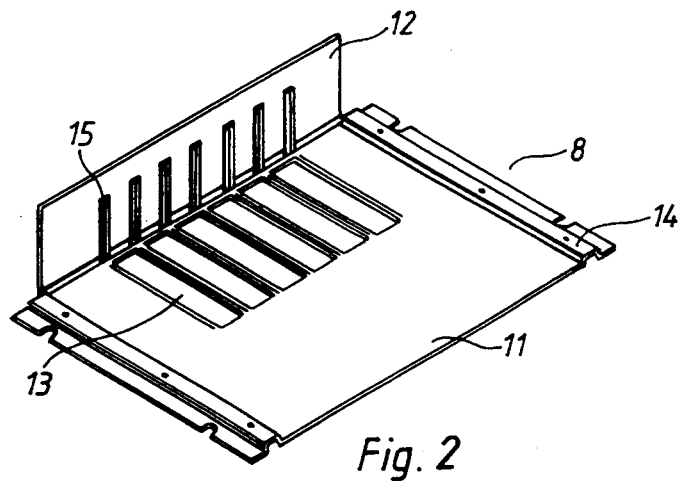
Fig. 2
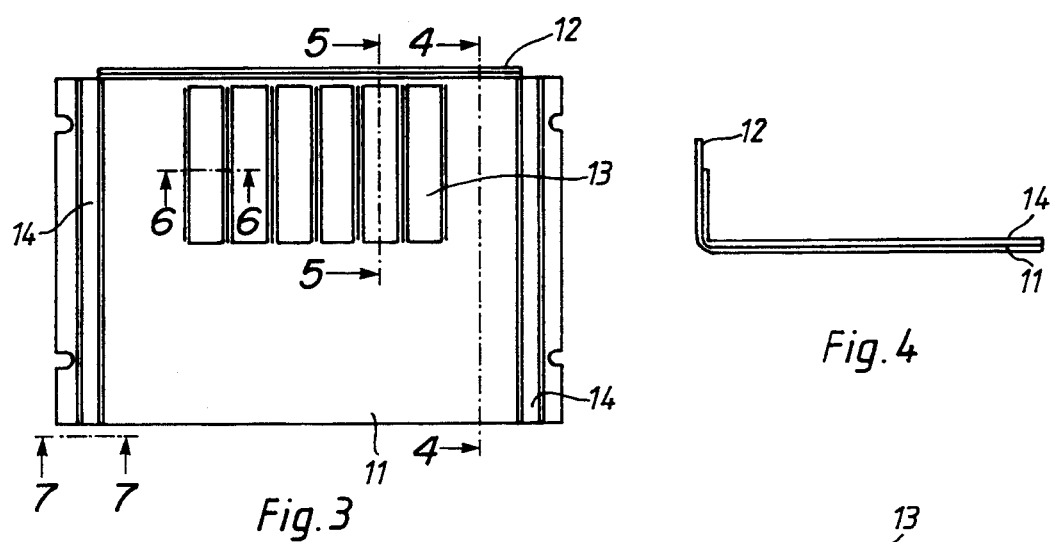
Fig. 3
Fig. 4
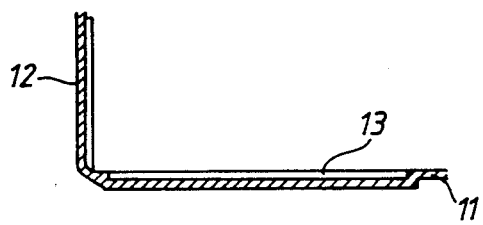
Fig. 5
Fig. 6
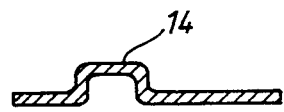
Fig. 7

VALVE STACK FOR HIGH VOLTAGES HAVING FIRE SCREEN MEANS LOCATED BETWEEN VALVE MODULES

This application is a continuation of application Ser. No. 817,651, filed Jan. 7, 1992, now abandoned.

BACKGROUND OF THE INVENTION

The present invention relates to a convertor valve for high voltages. Air-insulated types of these convertor valves are normally constructed in high valve stacks. These are composed of a number of electrically connected valve modules which may be arranged in floors one above the other with one or more valve modules on each floor. Each valve module comprises convertor valves which may be of thyristor type as well as auxiliary equipment such as voltage divider circuits in which, inter alia, oil-impregnated capacitors may be included. The valve modules may also be arranged in other ways in the valve stack; however, at some location in the stack a valve module will always be positioned above another valve module. A large fire in a valve module may therefore spread upwards to a valve module positioned above it in a valve stack.

SUMMARY OF THE INVENTION

According to the invention, the above-mentioned spread of the fire is avoided by the arrangement of fire screens between valve modules positioned one above the other.

In the case where the valve stack is divided into floors, at least two floor plans are to be isolated from each other by the arrangement of fire screens below the valve modules lying on the upper floor. In this way, at least these two floors in a valve stack will be isolated from each other from the point of view of fire. Still better from the point of view of fire is, of course, that all valve modules positioned above each other are isolated from each other by means of fire screens positioned between them, although this may lead to certain problems as regards deteriorated accessibility of equipment existing in the stack and possibly, to a certain extent, deteriorated cooling.

According to a suitable embodiment of the invention, the valve stack is divided along a substantially vertical section into two stack halves, separated by a vertically extending centre shaft. Each fire screen is thereby formed from two plates arranged in L-shape, one of the plates being placed in a substantially horizontal position below a valve module. The other plate is placed substantially vertically between the last-mentioned valve module and the centre shaft. The L-shaped screen is advantageously made in one piece from a sheet-formed glass-fibre material. The transition between a horizontal and a vertical screen is made rounded so as to ensure laminar flow of possible flue gases around the edge. The substantially horizontal plate is also provided with recesses or small trays for collecting any leaking oil from capacitors positioned above. The same plate is also inclined to a certain extent in a direction towards the outer edges of the valve stack to ensure that any water leakage is guided away from the valve module positioned below.

To facilitate detection of a fire in a valve module without equipping each valve module with its own detection equipment, the flue gases are passed out into the centre shaft and up through this to the equipment for flue gas detection arranged in the roof of the valve hall above the valve stack. Any work platforms in the centre shaft are designed so as to let through these flue gases, for example in the form of a lattice-work of plate bands standing on edge, or of electrically insulating laminates. In a similar manner, the L-shaped fire screens are made with a rounded transition from a horizontal to a vertical plate so as to obtain laminar flow of flue gas around the edge. In those cases where the valve stack has a corona shield as a roof, this shield is provided with openings above the centre shaft for emission of flue gases, if any.

BRIEF DESCRIPTION OF THE DRAWINGS

The invention will be most readily understood with reference to the accompanying drawings, wherein
FIG. 2 shows a fire screen according to the invention,
FIG. 3 shows a plan view of the fire screen of FIG. 2,
FIG. 4 shows a section 4—4 of FIG. 3,
FIG. 5 shows an enlarged section 5—5 of FIG. 3,
FIG. 6 shows an enlarged section 6—6 of FIG. 3,
FIG. 7 shows an enlarged section 7—7 of FIG. 3.

DETAILED DESCRIPTION OF THE PREFERRED EMBODIMENT

Figure 1:
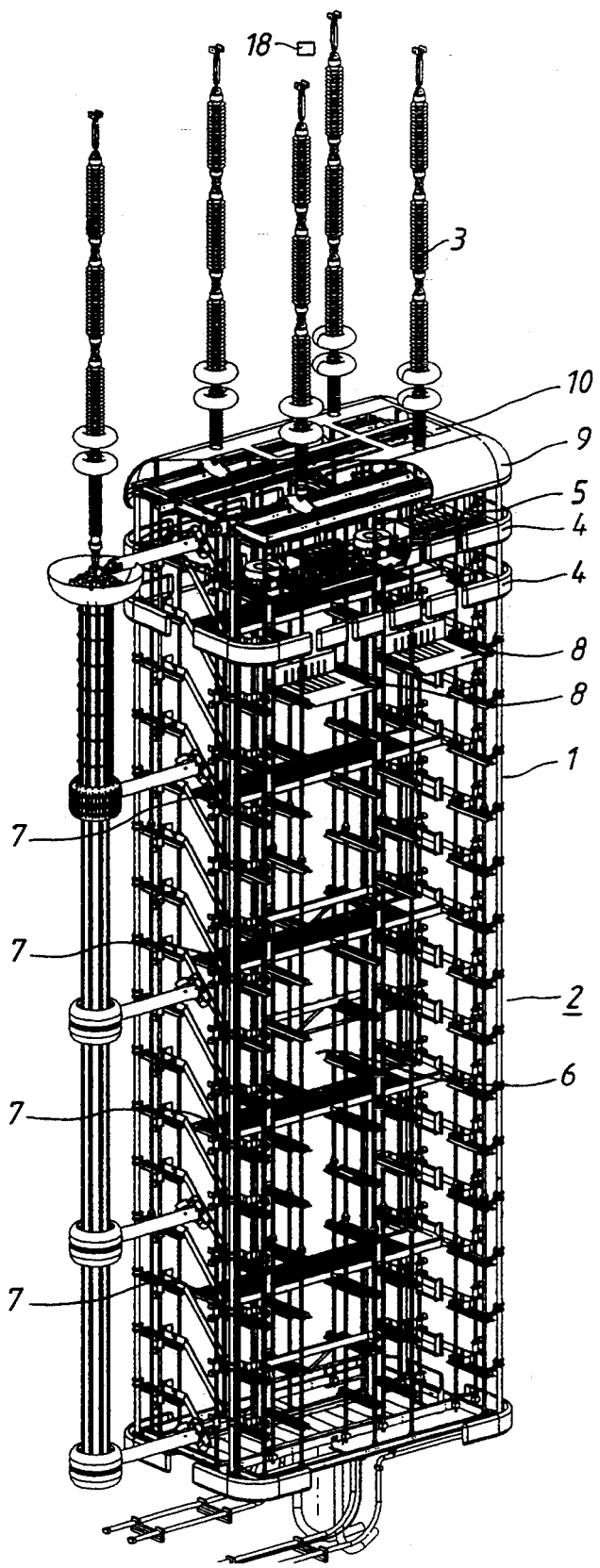
FIG. 1 shows a partially filled stand for a valve stack.

FIG. 1 shows a partially filled stand 1 for a valve stack 2 intended to be suspended by means of the insulators 3 from the roof of a valve hall. The valve stack consists of sixteen floors arranged one above the other. On each floor 4 there are four valve modules 2, two of which are located in the front part of the valve stack 2 and two in the rear part thereof, separated by the vertical centre shaft 6 arranged between the modules, the contours of the centre shaft being clear from the work platforms 7. For the sake of clarity, only the upper floor 4 is depicted equipped with valve modules 5 in the stand 1. In this case these valve modules include convertor valves of thyristor type and auxiliary equipment which, inter alia, comprises oil-impregnated capacitors 51.

In the third floor, counting from above, it is shown how the fire screens 8 are mounted with the substantially horizontal plate straight below a valve module 5 (not shown) and the vertical plate forming a demarcation towards the centre shaft. At the top the valve stack 2 is provided with a corona shield 9, in which openings 10 for any flue gases from the centre shaft 6 are provided. Straight above the valve stack in the ceiling of the valve hall, a flue gas detector 18 is arranged. The intention is for a possible fire in a valve module 5 to be rapidly detected by the flue gases from the valve module encountering the substantially horizontal part of the fire screen, arranged above the valve module 5, and there being deflected in a direction towards the centre shaft and up through this and the openings 10 of the corona shield 9 to the flue gas detector 18.

Figure 12:
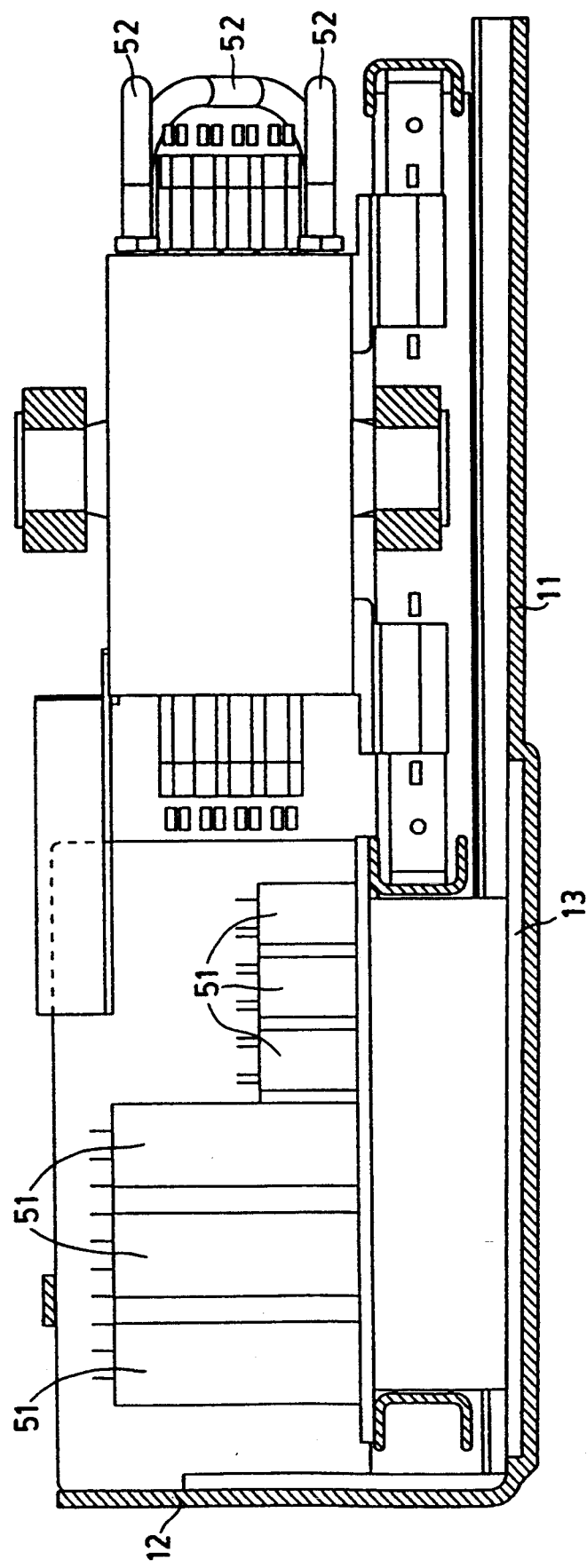
FIG. 12 is a cross sectional view of FIG. 11 as seen along line 12—12.
Figure 13:
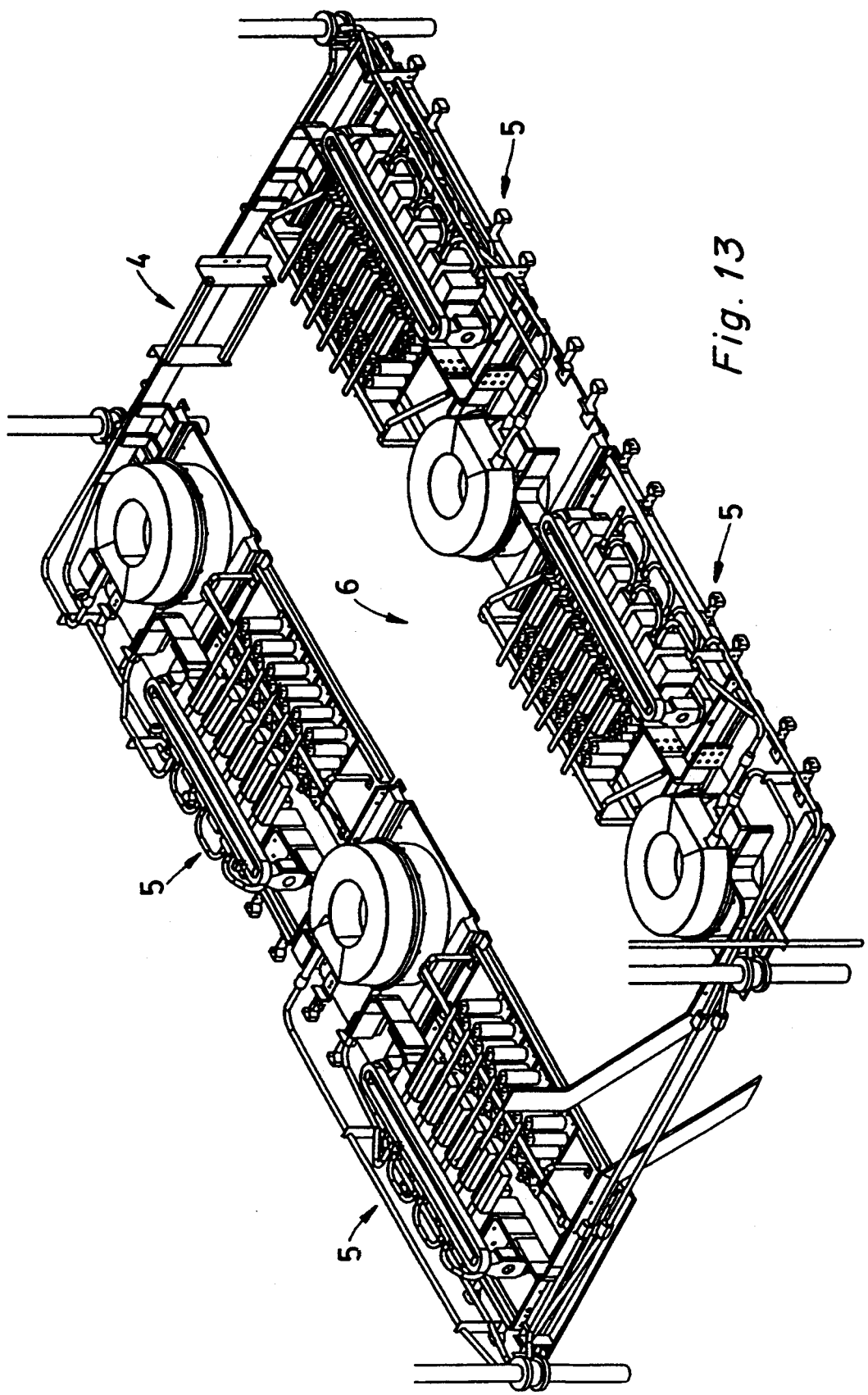
FIG. 13 is an enlarged perspective view of a floor of the valve stack which supports four valve modules, two of which are on one side of an opening (shaft) and two of which are on an opposite side.
Figure 14:
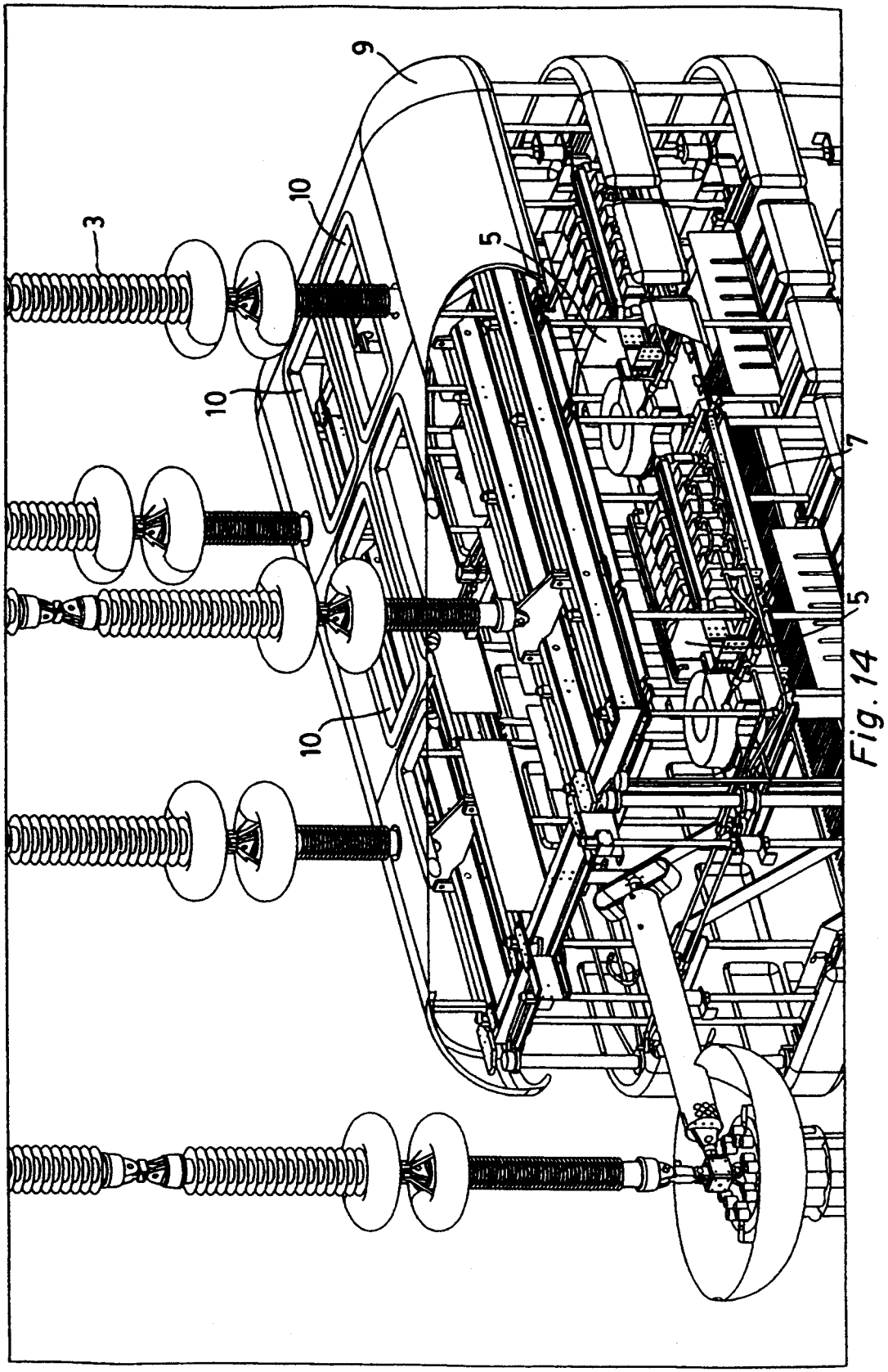
FIG. 14 is an enlarged perspective view of the top of the valve stack as shown in FIG. 1.

FIG. 2 shows a fire screen 8 consisting of a substantially horizontal plate 11 and a vertical plate 12. The plate 11 is provided with recesses 13 for collection of inflammable liquids which may possibly leak from a valve module 5 mounted above it (i.e., from oil-impregnated capacitors 51). The plane of the plate 11 itself is made such that, from the connecting line with the plate 12, it slopes slightly outwards towards the outer contour of the valve stack 2, whereas the fixing ridges 14 which delimit the plate 11 in the lateral direction are horizontal. This means that any other leakage dripping down onto the plate and not collected in the recesses 13, will run towards the outer contour of the valve stack 2. It is therefore suitable for apparatus containing burnable liquids to be arranged above the recesses 13 and for apparatus which are cooled by, for example, water to be placed above the smooth part of the plate 11 (see pipes 52 in FIG. 12). The vertical plate 12 is also provided with a number of vertical slots 15 intended to possibly receive vertically arranged, fire-resisting plates of laminate (not shown). These plates aim at limiting the horizontal spreading of fire within a valve module and will, of course, also contribute to reducing the risk of vertical spreading. The slots 15 as well as the slight outward inclination of the plate 11 contribute to pass flue gases, if any, into the centre shaft 6 and upwards therein in a laminar flow. FIG. 3 shows the fire screen 8 seen from above with the same designations inserted as in FIG. 2. FIGS. 4–7 show different sections of FIG. 3 with the same designations inserted.

Figure 8:
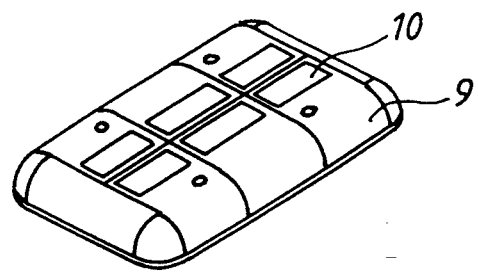
FIG. 8 shows a perspective view of a corona shield for the top of the valve stack.
Figure 9:
FIG. 9 shows a work platform, arranged in the centre shaft, seen from the side.
Figure 10:
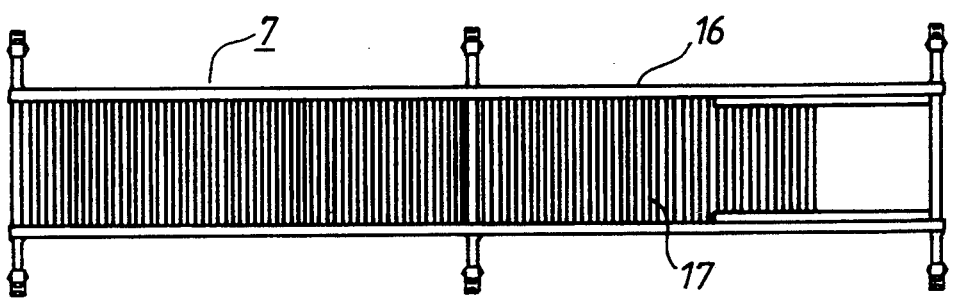
FIG. 10 shows the work platform according to FIG. 9, seen from above.
Figure 11:
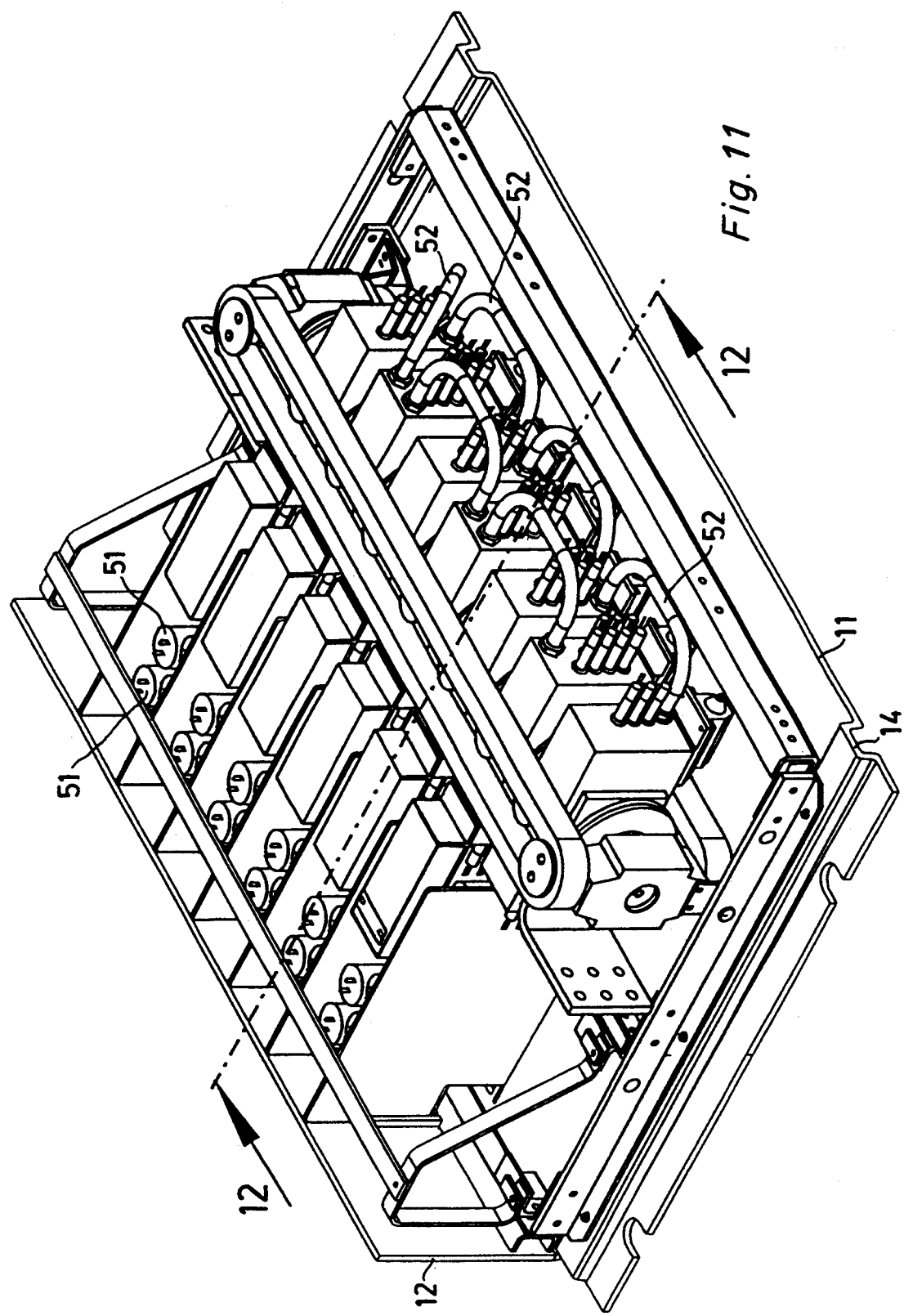
FIG. 11 shows an enlarged perspective view of a valve module with a fire screen according to the invention positioned therebelow.

FIG. 8 shows a corona shield 9 with openings 10, FIG. 9 shows a work platform 7 seen from the side, and FIG. 10 shows the same work platform seen from above. The work platform is designed to let through flue gases and may be formed from two longitudinal beams 16, between which bands 17 standing on end are provided.

The valve stack may, of course, be composed in some other way than that described above with a different number of floors 4 and valve modules 5. The valve modules may also be arranged stepped. The main feature is the provision, below a suitable number of valve modules, of a fire screen of the kind described.

As mentioned above, the fire screen may be formed from a sheet-formed glass-fibre material, but also other fire-resisting materials may, of course, be used.

We claim:

1. A valve stack for high voltages which comprises first and second electrically interconnected valve modules, said first valve module being located above said second valve module, each of said first and second valve modules having horizontal width and length dimensions, and means forming a fire screen located between said first and second valve modules for preventing the spread of fire from one of said first and second valve modules to the other of said first and second valve modules, said fire screen means having horizontal width and length dimensions at least equal to the horizontal width and length dimensions of said first and second valve modules.

2. A valve stack according to claim 1, including first and second floor means on which said first and second valve modules are respectively positioned, said first floor means being located above said second floor means, said fire screen means being positioned between said first and second floor means.

3. A valve stack according to claim 2, wherein each of said first and second floor means defines an open area that divides said floor means in half, said open areas of said first and second floor means defining a vertical control shaft in said valve stack.

4. A valve stack according to claim 3, including a cover positioned over a top of said valve stack, said cover providing an opening therethrough above said vertical central shaft.

5. A valve stack according to claim 3, including a work platform horizontally positioned in said central shaft, said work platform providing openings for gas flow therethrough.

6. A valve stack according to claim 3, wherein said fire screen means includes a first plate which is generally horizontally mounted in said valve stack.

7. A valve stack according to claim 6, wherein said fire screen means includes a second plate connected to said first plate, said second plate being generally vertically oriented to as to provide a generally L-shaped member, said second plate extending upwardly between said first valve module and said vertical central shaft.

8. A valve stack according to claim 7, wherein said first plate includes a recess for collecting inflammable liquids descending from said first valve module.

9. A valve stack according to claim 7, wherein said first plate is mounted so as to be slightly downwardly inclined as it extends away from said vertical central shaft.

10. A valve stack according to claim 7, wherein said first plate defines ridges adjacent opposite sides thereof which extend away from said vertical central shaft.

11. A valve stack according to claim 7, wherein said L-shaped member is of a one-piece construction.

* * * * *